US011513140B2

(12) United States Patent
Woo et al.

(10) Patent No.: US 11,513,140 B2
(45) Date of Patent: Nov. 29, 2022

(54) SENSOR PROBE WITH CLAMP HAVING ADJUSTABLE INTERIOR REGION FOR NON-CONTACT ELECTRICAL MEASUREMENT

(71) Applicant: Fluke Corporation, Everett, WA (US)

(72) Inventors: Ginger M. Woo, Shoreline, WA (US); Gloria M. Chun, Seattle, WA (US); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 62 days.

(21) Appl. No.: 17/169,113

(22) Filed: Feb. 5, 2021

(65) Prior Publication Data
US 2021/0239741 A1 Aug. 5, 2021

Related U.S. Application Data

(60) Provisional application No. 62/970,691, filed on Feb. 5, 2020.

(51) Int. Cl.
*G01R 15/18* (2006.01)
*G01R 19/00* (2006.01)

(52) U.S. Cl.
CPC ........... *G01R 15/186* (2013.01); *G01R 19/00* (2013.01)

(58) Field of Classification Search
CPC .... G01R 15/186; G01R 19/00; G01R 15/142; G01R 15/12; G01R 1/06788; G01R 1/22; G01R 19/155

(Continued)

(56) References Cited

U.S. PATENT DOCUMENTS 3,652,935 A * 3/1972 Shaw ...................... H01F 38/30
324/149
4,799,005 A * 1/1989 Fernandes ............ G01R 15/142
374/E1.004

(Continued)

FOREIGN PATENT DOCUMENTS

CN 107192868 A 9/2017
CN 208173327 U 11/2018

OTHER PUBLICATIONS

U.S. Appl. No. 62/421,124, filed Nov. 11, 2016.
(Continued)

*Primary Examiner* — Christopher P McAndrew
(74) *Attorney, Agent, or Firm* — Seed Intellectual Property Law Group LLP

(57) ABSTRACT

A sensor probe includes a body, a sleeve that is moveable along the body between open and closed positions, a clamp having first and second jaws that contain an interior region within the clamp, and a non-contact sensor coupled to the sleeve and positioned at or near a perimeter of the interior region within the clamp. When the sleeve is in the open position, the first and second jaws create a gap that allows an insulated conductor to pass into the interior region within the clamp. When the sleeve is in the closed position, the first and second jaws close the gap and thereby close the interior region within the clamp. The size of the interior region is reduced when the sleeve is moved toward the closed position. The non-contact sensor is configured to detect an electrical parameter of the insulated conductor without requiring galvanic contact with the conductor.

20 Claims, 7 Drawing Sheets

(58) Field of Classification Search
USPC .......................................................... 324/127
See application file for complete search history.

(56) References Cited

U.S. PATENT DOCUMENTS

| | | | |
|---|---|---|---|
| 5,473,244 A | 12/1995 | Libove et al. | |
| 6,456,060 B1 * | 9/2002 | Wiesemann | G01R 1/22 |
| | | | 324/156 |
| 6,975,104 B2 * | 12/2005 | Gregorec, Jr. | G01R 1/22 |
| | | | 324/99 D |
| 7,259,546 B1 * | 8/2007 | Hastings | G01R 15/202 |
| | | | 324/126 |
| 8,120,350 B2 * | 2/2012 | Shah | G01R 1/22 |
| | | | 324/126 |
| 8,330,449 B2 * | 12/2012 | Greenberg | G01R 15/12 |
| | | | 324/126 |
| 9,791,479 B2 * | 10/2017 | Tierney | G01R 19/0092 |
| 10,119,998 B2 | 11/2018 | Ringsrud et al. | |
| 10,139,435 B2 | 11/2018 | Steuer et al. | |
| 10,281,503 B2 | 5/2019 | Steuer et al. | |
| 10,295,574 B2 * | 5/2019 | Nanshan | H01F 27/24 |
| 10,352,967 B2 * | 7/2019 | Steuer | G01R 15/16 |
| 10,591,515 B2 | 3/2020 | Rodriguez et al. | |
| 10,746,767 B2 | 8/2020 | Worones et al. | |
| 2006/0082356 A1 | 4/2006 | Zhang et al. | |
| 2013/0257412 A1 | 10/2013 | Wynne | |
| 2015/0002138 A1 | 1/2015 | Fox | |
| 2018/0136257 A1 * | 5/2018 | Steuer | G01R 15/16 |
| 2019/0346492 A1 | 11/2019 | Worones et al. | |

OTHER PUBLICATIONS

Extended European Search Report for Application No. EP 21 15 5537.0, dated Jun. 28, 2021, 9 pgs.
Extended European Search Report for Application No. EP 21 15 5533.9, dated Jun. 17, 2021, 8 pgs.

* cited by examiner

SENSOR PROBE WITH CLAMP HAVING ADJUSTABLE INTERIOR REGION FOR NON-CONTACT ELECTRICAL MEASUREMENT

BACKGROUND

Technical Field

The present disclosure generally relates to electrical parameter measurement devices, and more particularly, to sensor probes for electrical parameter measurement devices.

Description of the Related Art

Voltmeters are instruments used for measuring voltage in an electric circuit. Instruments which measure more than one electrical parameter are referred to as multimeters, and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with the conductor being measured, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

In addition, when measuring current, a break in the circuit is required to insert a multimeter in series with the conductor to be measured. Moreover, a multimeter employing an internal current shunt may be generally limited to measuring ten amperes maximum, for example, because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact measuring instrument that requires no internal fuse.

A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact AC voltage detectors provide only an indication of the presence or absence of an AC voltage, and do not provide an indication of the actual magnitude (e.g., RMS value) of the AC voltage.

Clamp-on multimeters provide improved capability for measuring current over general purpose multimeters by employing an integral current clamp that senses the current in the conductor being measured without having to cut the current-carrying conductor or break the circuit including the current-carrying conductor. A current clamp is typically provided in the same housing with a multimeter which measures other parameters such as voltage and resistance in the conventional manner using separate test probes. The current clamp is closed around the current-carrying conductor, which may include a copper wire or buss bar, for example, to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured is largely eliminated. Likewise, the internal fuse is eliminated in clamp-on multimeters.

Nevertheless, conventional clamp-on multimeters require a large physical space for the multimeter and the clamp to operate and are therefore difficult to use in confined spaces such as an electrical cabinet. Clamp-on multimeters also tend to be physically heavy.

BRIEF SUMMARY

Disclosed herein is an electrical parameter sensor probe operative to detect an electrical parameter in an insulated conductor without requiring galvanic contact with the insulated conductor. The sensor probe may be summarized as including a body, a sleeve, a clamp, and a non-contact sensor. In at least one embodiment, the sleeve is fitted to the body, and is movable along the body between a closed position and an open position. The clamp includes a first jaw and an opposing second jaw. At least one of the first jaw and the second jaw is positioned at least partially within the sleeve when the sleeve is in the closed position. When the first and second jaws are closed against each other, the first and second jaws contain an interior region within the clamp. The non-contact sensor is coupled to the sleeve and positioned at or near a perimeter of the interior region within the clamp. The non-contact sensor is operative to sense at least one electrical parameter of the insulated conductor without requiring galvanic contact with the conductor when the insulated conductor is positioned within the interior region of the clamp.

When the sleeve is retracted along the body to the open position, the first jaw and the second jaw are configured to separate from each other and create a gap that allows the insulated conductor to pass between the jaws into the interior region within the clamp. When the sleeve is extended along the body toward the closed position, the first jaw and the second jaw are configured to close the gap and thereby close the interior region within the clamp. The size of the interior region within the clamp is adjustable by movement of the sleeve along the body.

In various embodiments, at least one of the first jaw or the second jaw is coupled to a hinge. When the sleeve is retracted toward the open position, the jaw pivots about the hinge away from the other jaw to create the gap. In some embodiments, the first jaw and the second jaw are each coupled to a hinge, and when the sleeve is retracted toward the open position, both the first jaw and the second jaw pivot about the hinge away from each other to create the gap.

In various embodiments, at least a portion of the sleeve is positioned within the body when the sleeve is retracted toward the open position. In some embodiments, at least a portion of the body is positioned within the sleeve when the sleeve is retracted toward the open position.

The sensor probe may include a biasing element that biases the sleeve toward the closed position. The sensor probe may include a locking element that releasably secures the sleeve in at least one of the open position or the closed position when the sleeve is retracted to the open position or extended to the closed position, respectively.

The sensor probe may include a biasing element that biases at least one of the first jaw or the second jaw away from the other of the first or second jaw when the sleeve is retracted toward the open position. Alternatively, the sensor probe may include a biasing element that biases at least one of the first jaw or the second jaw toward the other of the first or second jaw when the sleeve is extended toward the closed position.

In various embodiments, when the sleeve is retracted toward the open position, a greater portion of at least one of the first jaw or the second jaw is exposed outside the sleeve. In some embodiments, when the insulated conductor is positioned within the interior region of the clamp, the non-contact sensor coupled to the sleeve is operative to sense a voltage in the insulated conductor without requiring galvanic contact with the conductor.

In various embodiments, the size of the interior region within the clamp is reduced when the sleeve is extended toward the closed position. In some embodiments, when the insulated conductor is positioned within the interior region of the clamp, the reduced size of the interior region causes the insulated conductor to be positioned proximate to the non-contact sensor.

In various embodiments, the non-contact sensor coupled to the sleeve is a first non-contact sensor, and the sensor probe further includes a second non-contact sensor positioned on the first jaw or the second jaw at or near the perimeter of the interior region within the clamp. The second non-contact sensor is operative to sense at least one additional electrical parameter of the insulated conductor when the insulated conductor is positioned within the interior region of the clamp.

A device for measuring an electrical parameter in an insulated conductor may be summarized as including an electrical parameter sensor probe according to any of the embodiments described above, along with control circuitry that processes sensor data indicative of a signal detected by the non-contact sensor in the sensor probe, to measure the electrical parameter of the insulated conductor being measured.

In various embodiments, the device may include a main body that contains the control circuitry. In such embodiments, the sensor probe is detachably connectable to at least one interface connector of the main body. In other embodiments, the body of the sensor probe contains the control circuitry.

In various embodiments, a sensor probe operative to detect an electrical parameter of an insulated conductor may be summarized as including a body having a sleeve that is moveable along the body between an open position and a closed position, a clamp having a first jaw and an opposing second jaw that, when closed against each other, contain an interior region within the clamp, and a non-contact sensor coupled to the sleeve and positioned at or near a perimeter of the interior region within the clamp. The non-contact sensor is operative to detect at least one electrical parameter of the insulated conductor without requiring galvanic contact with the conductor when the insulated conductor is positioned within the interior region of the clamp.

When the sleeve is in the open position, the first and second jaws are positioned apart from each other to create a gap that allows the insulated conductor to pass between the jaws into the interior region within the clamp. When the sleeve is in the closed position, the first and second jaws are positioned to close the gap and thereby close the interior region within the clamp. The size of the interior region within the clamp is reduced when the sleeve is moved toward the closed position.

In at least some embodiments, the sensor probe is configured such that, when the insulated conductor is positioned within the interior region of the clamp, the first and second jaws detect a current and the non-contact sensor detects a voltage of the insulated conductor, without requiring galvanic contact with the conductor.

Figure 2:
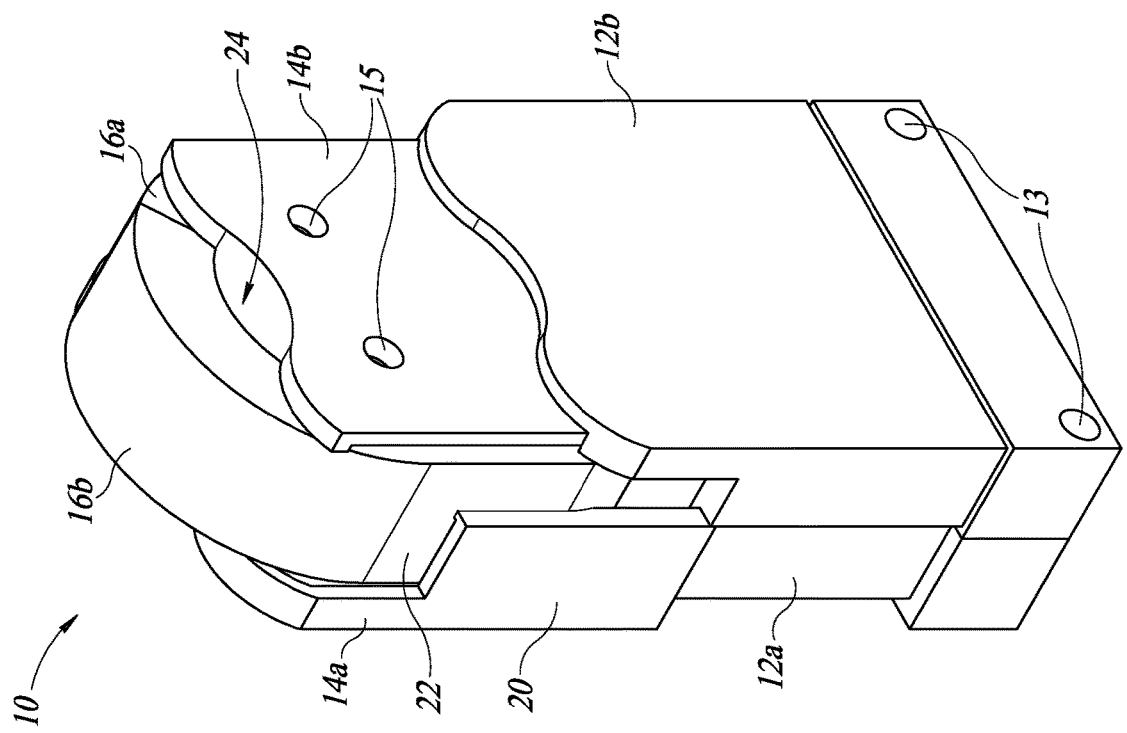
FIG. 2 is a rear, right perspective view of the sensor probe of FIG. 1.

In the drawings, identical reference numbers identify similar elements. The sizes and relative positions of elements in the drawings are not necessarily drawn to scale. For example, the shapes of various elements and angles and spaces between elements are not necessarily drawn to scale, and some of these elements may be arbitrarily enlarged and positioned to improve drawing legibility. Further, the particular shapes of the elements as drawn are not necessarily intended to convey information regarding any required shape of the elements, and may have been selected solely for ease of recognition in the drawings.

DETAILED DESCRIPTION

One or more embodiments of the present disclosure are directed to an electrical parameter sensor probe and to devices and methods for measuring electrical parameters (e.g., voltage, current) in an insulated electrical conductor (e.g., insulated wire) without requiring a galvanic connection with the conductor. As described herein, an electrical parameter measurement device is configured to measure one or more electrical parameters in an insulated conductor. Such devices that do not require a galvanic connection with the conductor to measure the parameter(s) are non-contact devices. As used herein, a "non-contact" device or sensor is operative to detect an electrical parameter in an insulated conductor without requiring galvanic contact with the conductor.

In various embodiments, a non-contact electrical parameter sensor probe is provided. The sensor probe is operative to accurately measure voltage, and possibly also current, in an insulated conductor under test. The sensor probe includes a body, a sleeve, a clamp having opposing jaws, and a non-contact sensor coupled to at least a portion of the sleeve. The sleeve is fitted to the body and is movable along the body between a closed position and an open position. Within the clamp, between the opposing jaws, is an interior region, the size of which is selectively adjustable. With movement of the sleeve toward the closed position, the size of the interior region may be reduced until an insulated conductor under test in the interior region is positioned proximate to the portion of the sleeve that includes the non-contact sensor. Thus positioned proximate to the conductor, the non-contact sensor may obtain accurate measurements (e.g., of the voltage) of the conductor. At the same time, in at least some embodiments, the clamp is closed around the conductor and is configured to obtain accurate current measurements of the conductor. Additionally, one or more electrical parameters, such as power or phase angle, may be derived using the obtained voltage and current measurements. The measured electrical parameters may be provided to a user, e.g., via a display, or may be transmitted to one or more external systems via a suitable wired or wireless connection.

In the following description, certain specific details are set forth in order to provide a thorough understanding of various disclosed implementations. However, a person skilled in the art will recognize that additional implementations may be practiced without one or more of these specific details, or with other methods, components, materials, etc.

Additionally, reference throughout this specification to "one embodiment" or "an embodiment" means that a particular feature, structure or characteristic described in connection with the embodiment is included in at least one embodiment. Furthermore, appearance of the phrase "in at least one embodiment" in this specification does not necessarily refer to only one embodiment. The particular features, structures, or characteristics of the various embodiments described herein may be combined in any suitable manner in yet additional embodiments.

Figure 1:
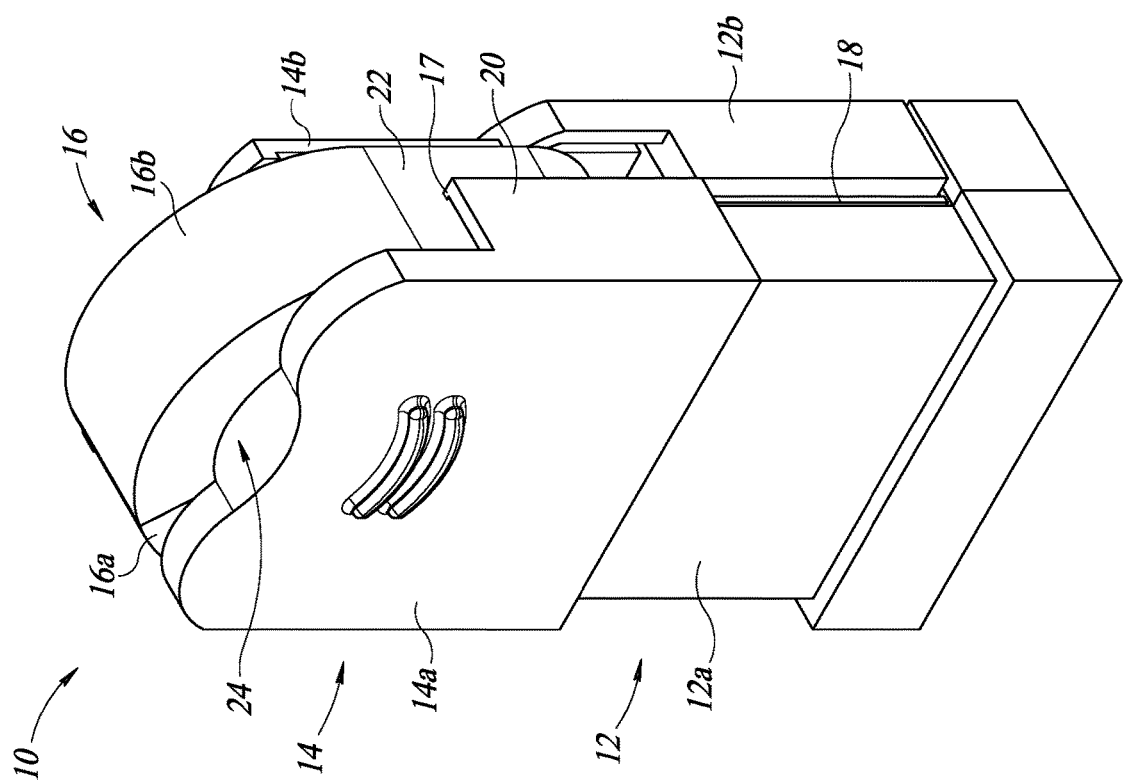
FIG. 1 is a front, right perspective view of at least one non-limiting embodiment of an electrical parameter sensor probe that includes a body, a sleeve, a clamp, and a non-contact sensor, wherein the sleeve is shown in a closed position.

FIG. 1 is a front, right perspective view of at least one non-limiting embodiment of a sensor probe 10 operative to detect an electrical parameter of an insulated conductor. The sensor probe 10 includes a body 12, a sleeve 14, a clamp 16, and a non-contact sensor 20 (see FIG. 3). In FIG. 1, the sleeve 14 is shown in a closed position. FIG. 2 depicts a rear, right perspective view of the sensor probe 10 shown in FIG. 1.

The body 12 of the sensor probe 10 includes a front 12a that is coupled to a rear 12b. The front 12a may be fixedly coupled or detachably coupled to the rear 12b. In FIG. 2, screws or other suitable fasteners may be inserted through apertures 13 in the rear 12b to couple the rear 12b to the front 12a of the body.

Similarly, the sleeve 14 includes a front 14a and a rear 14b. The front 14a may be fixedly coupled or detachably coupled to the rear 14b. In FIG. 2, screws or other suitable fasteners may be inserted through apertures 15 in the rear 14b to couple the rear 14b to the front 14a of the sleeve.

In the embodiment shown in FIG. 1, at the juncture between the front and rear 12a, 12b of the body 12 is a track 18 along which the sleeve 14 can slide. The front 14a of the sleeve includes a lip 17 that is fitted into the track 18 so that the sleeve 14 is slidably coupled to the body 12. Preferably, the lip 17 and track 18 are implemented on both sides (e.g., right side and left side) of the sensor probe 10, though in some embodiments, the lip 17 and the track 18 may be implemented on only one side of the sensor probe 10. As will be further described herein, using the track 18, the sleeve 14 is movable along the body 12 between the closed position shown in FIG. 1 and an open position, e.g., as shown in FIG. 3.

The clamp 16 includes a first jaw 16a and an opposing second jaw 16b. In various embodiments, at least one of the first jaw 16a and the second jaw 16b is positioned at least partially within the sleeve 14 when the sleeve is in the closed position. In FIGS. 1 and 2, with the sleeve 14 in the closed position, both the first jaw 16a and the second jaw 16b are positioned partially within the sleeve 14. In particular, as illustrated, a right side 22 of the clamp 16 is shown positioned within a right side 20 of the front 14a of the sleeve 14. The left side of the clamp 16 is likewise positioned within a left side of the front 14a of the sleeve 14, e.g., as depicted at least partly in FIG. 7.

In FIGS. 1 and 2, the first and second jaws 16a, 16b are closed against each other. When the first and second jaws are closed against each other, the first and second jaws contain an interior region 24 within the clamp 16. As will be further described herein, the size of the interior region 24 is adjustable by movement of the sleeve 14 along the body 12.

Figure 3:
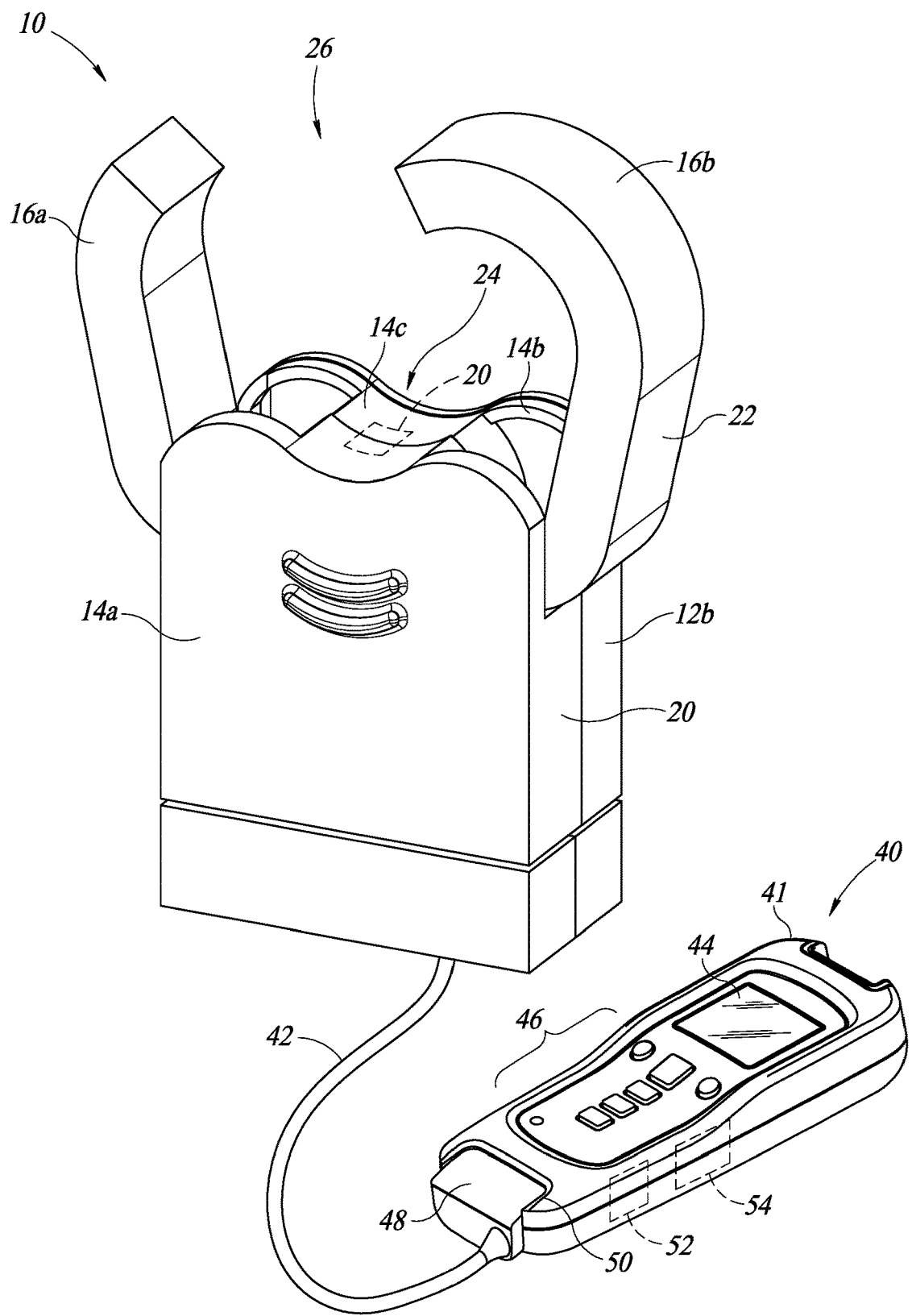
FIG. 3 is a pictorial diagram of a device for measuring an electrical parameter of an insulated conductor, the device including a sensor probe as shown in FIG. 1 communicatively coupled to a measuring instrument, wherein the sleeve is shown in an open position and jaws of the clamp are opened.

FIG. 3 is a pictorial diagram of a device for measuring an electrical parameter of an insulated conductor. In FIG. 3, the device includes a sensor probe 10 as shown in FIG. 1 communicatively coupled to a measuring instrument 40. With regard to the sensor probe 10, the sleeve 14 is shown in FIG. 3 in an open position. Additionally, the jaws 16a, 16b of the clamp 16 are open (i.e., separated from one another).

The sleeve 14 includes a concave saddle 14c with a non-contact sensor 20 (e.g., a non-contact voltage sensor) coupled thereto or positioned therein. The non-contact sensor 20 operates to sense one or more electrical parameters in an insulated conductor 30 under test (see FIGS. 4 and 5). Additionally or alternatively, one or more non-contact sensors may be coupled to or positioned in one or both of the jaws 16a, 16b of the clamp 16. The non-contact sensor 20 (and other non-contact sensors, if included) may be electrically connected to a cable 42 such that signals from the sensor are communicated to the main body 41 of the measuring instrument 40 for processing. The non-contact sensor(s) may include a non-contact voltage sensor, a non-contact current sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the conductor 30 without requiring galvanic contact. Various non-limiting examples of non-contact sensors are disclosed in U.S. Provisional Patent Application No. 62/421,124, filed Nov. 11, 2016; U.S. Pat. No. 10,119,998, issued Nov. 6, 2018; U.S. Pat. No. 10,139, 435, issued Nov. 27, 2018; U.S. Pat. No. 10,281,503, issued May 7, 2019; U.S. Pre-Grant Publication No. 2018/ 0136260, published May 17, 2018, and U.S. Pat. No. 10,352, 967, issued Jul. 16, 2019, the contents of which are incorporated herein by reference, in their entirety.

Figure 4:
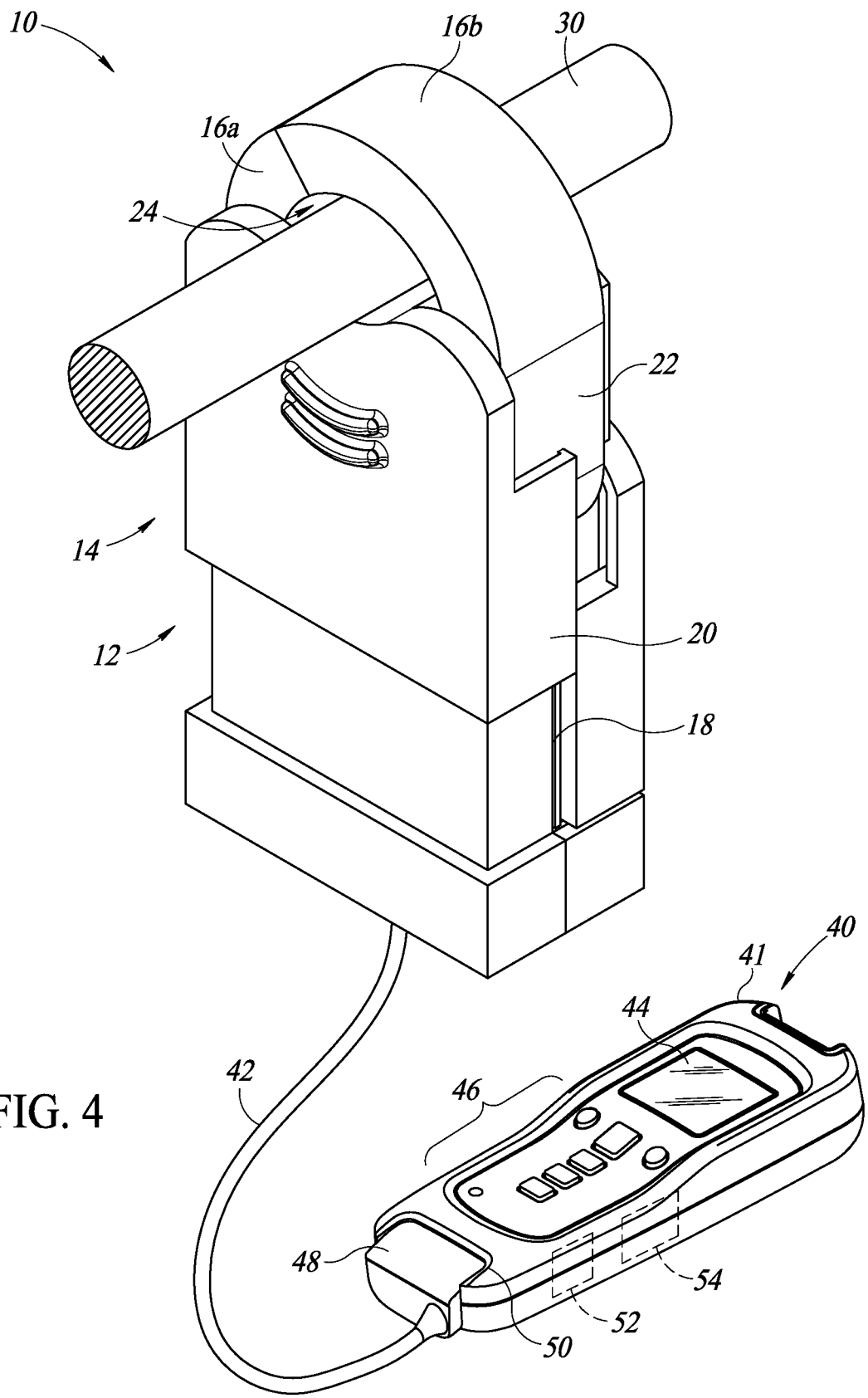
FIG. 4 is a pictorial diagram of the device of FIG. 3, wherein the sleeve is shown in a partially closed position and the jaws of the clamp are closed around an insulated conductor under test.
Figure 5:
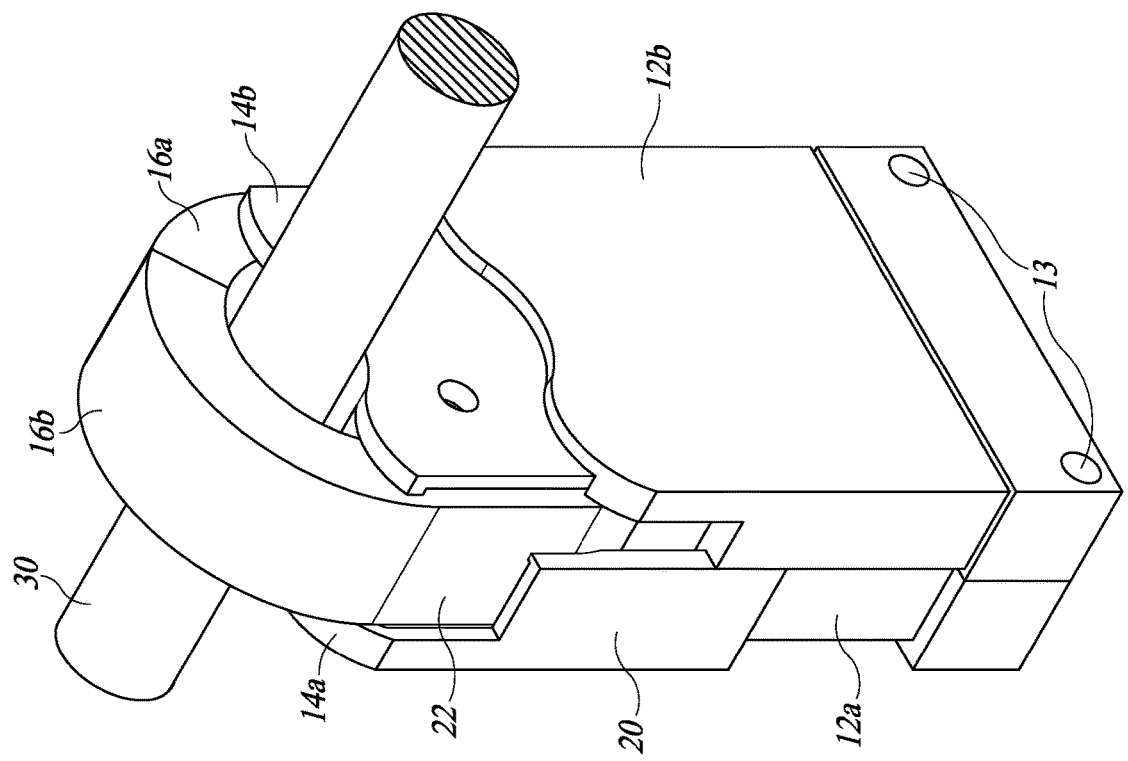
FIG. 5 is a rear, right perspective view of the sensor probe of FIG. 1, wherein the sleeve is shown in a partially closed position and the jaws of the clamp are closed around an insulated conductor under test as shown in FIG. 4.

FIG. 4 is a pictorial diagram of the device of FIG. 3, wherein the sleeve 14 is shown in a partially closed position and the jaws 16a, 16b of the clamp are closed around an insulated conductor 30 under test. Similarly, FIG. 5 is a rear, right perspective view of the sensor probe of FIG. 1, wherein the sleeve is shown in a partially closed position and the jaws of the clamp are closed around an insulated conductor under test, as shown in FIG. 4.

The non-contact sensor 20 in FIG. 3 is coupled to at least a portion of the sleeve and positioned at or near a perimeter of the interior region 24 within the clamp 16. When the insulated conductor 30 is positioned within the interior region 24 as shown in FIGS. 4 and 5, the non-contact sensor 20 is operative to sense at least one electrical parameter of the insulated conductor 30 without requiring galvanic contact with the conductor 30.

The device shown in FIGS. 3 and 4 includes a sensor probe 10 and a measuring instrument 40 with a main body (or housing) 41. In FIGS. 3 and 4, the scale of the sensor probe 10 is an enlarged compared to the scale of the measuring instrument 40 so as to provide a better depiction of the details of the sensor probe 10. Generally, in an actual implementation, the sensor probe 10 is smaller in size in comparison to the measuring instrument 40.

The body 12 of the sensor probe 10 is coupled to an interface connector 48 by way of the cable 42. The main body 41 includes an interface connector 50 that detachably couples with the corresponding interface connector 48 of the sensor probe 10.

The main body 41 further includes a display 44 that presents measurement results and other information to a user of the measuring instrument 40, as well as a user interface 46 for the user to input information and/or provide instructions to the measuring instrument 40. The display 44 may be a display of any suitable type, such as a liquid crystal display (LCD), a light-emitting diode (LED) display, an organic LED display, a plasma display, or an e-ink display. The main body 41 may include one or more audio or haptic outputs (not shown), such as one or more speakers, buzzers, vibration devices, etc. In the illustrated embodiment, the user interface 46 comprises a plurality of buttons, but in other implementations the user interface 46 may additionally or alternatively include one or more other types of input devices, such as a touch pad, touch screen, wheel, knob, dial, microphone, etc.

The main body 41 may also include a power supply (not shown), such as a battery or battery pack, for supplying power to various components of the measuring instrument 40 and possibly also the sensor probe 10. The main body 41 further includes control circuitry 52 that controls the various operations of the measuring instrument 40, such as receiving signals from the sensor probe 10, determining one or more electrical parameters of an insulated conductor 30 under test, and outputting measurement data (e.g., to the display 44). The control circuitry 52 may include one or more processors (e.g., microcontroller, DSP, ASIC, FPGA), one or more types of memory (e.g., ROM, RAM, flash memory, other non-transitory storage media), and/or one or more other types of processing or control related components.

In at least some embodiments, the main body 41 may further include a wireless communications subsystem 54, which may incorporate one or more of a Bluetooth® module, a Wi-Fi® module, a ZIGBEE® module, a near field communication (NFC) module, etc. The measuring instrument 40 may thus communicate wirelessly via the wireless communications subsystem 54 with an external receiving system, such as a computer, smart phone, tablet, personal digital assistant, etc., so as to transmit measurement results to the external system or to receive instruction signals or input information from an external system. The main body 41 may additionally or alternatively include a wired communications subsystem, such as a USB interface, etc.

Although for explanatory purposes only one sensor probe 10 is shown in FIGS. 3 and 4, in at least some implementations, a plurality of sensor probes may be detachably coupled to the main body 41 of the measuring instrument 40. In addition, the plurality of sensor probes may differ in at least one of shape, structure, or function, for example, to provide different functionality for the measuring instrument 40.

In at least some embodiments, the interface connector 48 of the sensor probe 10 may be configured as one of a plug and a socket, and the interface connector 50 of the main body 41 may be configured as the other of the plug and socket. In other implementations, the interface connectors 48 and 50 may be configured as different types of connectors that are operative to detachably couple to one other.

Further, in some implementations, the sensor probe 10 may be fixedly connected to the main body 41 by the cable 42. In yet other implementations, the sensor probe 10 and the main body 41 may be formed together in a single housing, such that the cable 42 is not required.

In at least some implementations, in operation, the sensor probe 10 may include circuitry that transmits measurement data from the sensor 20 or the clamp 16 to the main body 41 of the measuring instrument 40, and the control circuitry 52 determines one or more electrical parameters of the conductor 30 based on the received measurement data. For example, the control circuitry 52 may utilize one or more mathematical formulas, lookup tables, calibration factors, etc., to determine the one or more electrical parameters. Further, some electrical parameters, such as power or phase angles, may be derived from other determined electrical parameters, such as current and voltage.

Returning to FIGS. 1 and 2, as mentioned above, the sleeve 14 is shown extended in the closed position. When the sleeve 14 is retracted along the body 12 (i.e., along the track 18) toward the open position shown in FIG. 3, the first jaw 16a and the second jaw 16b are configured to separate from each other and create a gap 26. The gap 26 allows an insulated conductor 30 to pass between the jaws 16a, 16b into the interior region 24 within the clamp 16, as shown in FIGS. 4 and 5. When the sleeve 14 is extended along the body (i.e., along the track 18) toward the closed position, the first jaw 16a and the second jaw 16b are configured to close the gap 26 and thereby close the interior region 24 within the clamp 16, as shown in FIGS. 4 and 5.

In at least some embodiments, as the sleeve 14 is moved along the body 12 toward the closed position, the sides of the sleeve 14 (e.g., the sides 20 of the front 14a of the sleeve) mechanically push the jaws 16a, 16b toward each other, to close the interior region 24 within the clamp 16. When the sleeve is in the closed position (as shown in FIGS. 1 and 2) or in a partially closed position (as shown in FIGS. 4 and 5), the jaws 16a, 16b are thus positioned within at least part of the sleeve 14.

In the embodiment in FIGS. 1-8, and shown in particular in FIG. 3, when the sleeve 14 is retracted toward the open position, the rear portion 14b of the sleeve 14 is positioned within the rear portion 12b of the body 12. With this embodiment, a user of the sensor probe 10 is able to securely grasp the body 12 while pulling (or retracting) the sleeve 14 downward to the open position. Similarly, the user is able to maintain a secure hold of the body 12 while pushing (or extending) the sleeve 14 upward toward the closed position.

Also, with the embodiments of the sensor probe 10 described herein, a portion or all of the body 12 is positioned within the sleeve 14 when the sleeve 14 is retracted toward the open position. In the embodiment in FIGS. 1-8, and shown in particular in FIG. 3, the front 12a of the body 12 is positioned behind the front 14a of the sleeve 14 (i.e., within the sleeve 14) when the sleeve 14 is in the open position.

When the sleeve 14 in the closed position (e.g., as shown in FIGS. 1 and 2, as well as FIGS. 9 and 10), the top portions of the jaws 16a and 16b are exposed outside the sleeve 14. In the embodiment shown in FIGS. 1-8, the rear portions of the jaws 16a, 16b are also partly exposed outside the sleeve 14, while the front portions of the jaws 16a, 16b are contained within the sidewalls 20 of the sleeve 14. When the sleeve 14 is retracted (partially or fully) toward the open position, a greater portion of at least one of the jaws 16a, 16b is exposed outside the sleeve 14.

When the sleeve 14 is in the open position, e.g., as shown in FIG. 3, the interior region 24 within the clamp 16 is maximized. This provides sufficient space for an insulated conductor 30, as shown in FIGS. 4 and 5, to pass through the gap 26 and be situated within the interior region 24. When the sleeve 14 is extended toward the closed position, the size of the interior region 24 is reduced. In at least one embodiment, the sleeve 14 is extended upward, reducing the size of the interior region 24, until either the sleeve 14 is in a partially closed position and bears against the insulated conductor 30 as shown in FIGS. 4 and 5, or the sleeve 14 is in a fully closed position. Thus, when the insulated conductor 30 is positioned within the interior region 24 of the clamp 16, the reduced size of the interior region 24 causes the insulated conductor 30 to sit within the saddle 14c of the sleeve and be positioned proximate to the non-contact sensor 20. Depending on the size of the insulated conductor 30, the closed jaws 16a, 16b may also bear against the insulated conductor 30 as shown in FIGS. 4 and 5, and thus help maintain the position of the insulated conductor 30 within the saddle 14c proximate to the non-contact sensor 20.

As mentioned earlier, the sensor probe 10 may include more than one non-contact sensor. In at least some embodiments, the non-contact sensor 20 coupled to the sleeve 14 is a first non-contact sensor, and the sensor probe 10 further includes a second non-contact sensor positioned on the first jaw 16a and/or the second jaw 16b at or near the perimeter of the interior region 24 within the clamp 16. The second non-contact sensor is operative to sense at least one additional electrical parameter of an insulated conductor 30 when the insulated conductor 30 is positioned within the interior region 24.

Figure 6:
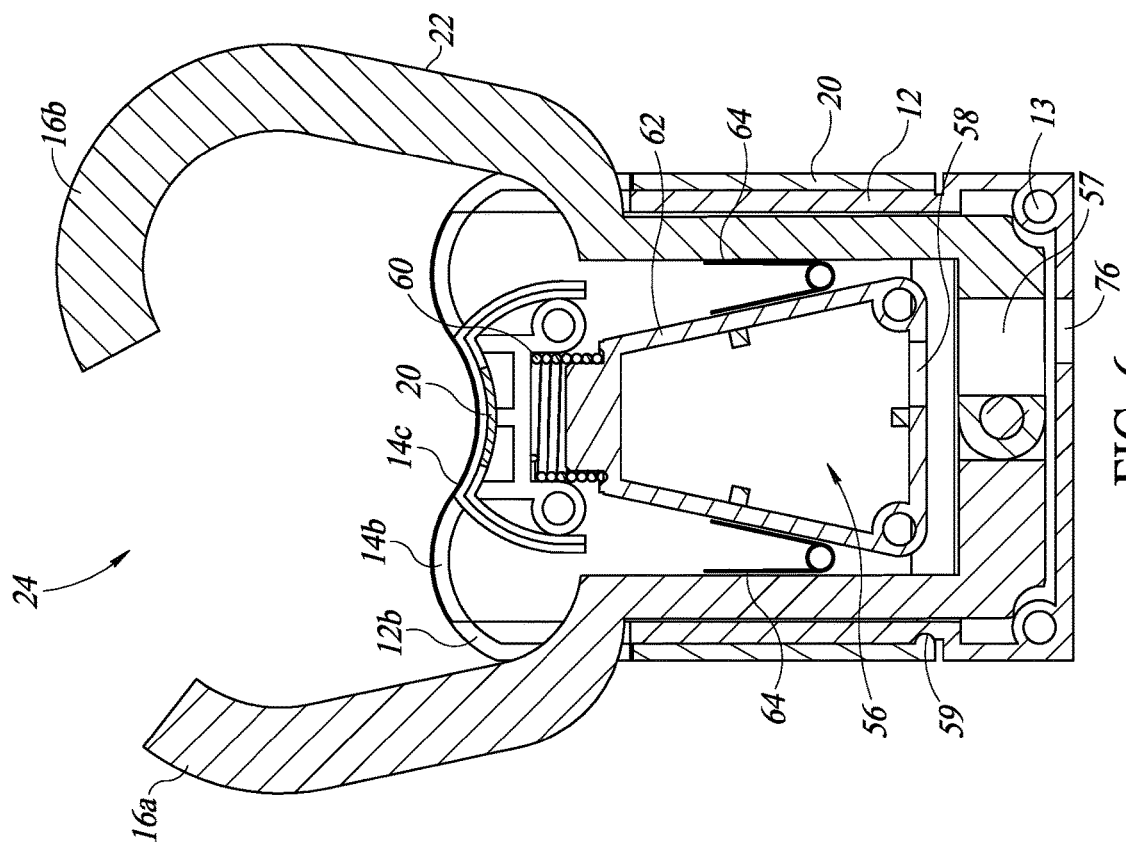
FIG. 6 is a cross-section view of the sensor probe of FIG. 1, wherein the sleeve is shown in an open position and jaws of the clamp are open.

FIG. 6 is a cross-section view of the sensor probe 10 of FIG. 1, wherein the sleeve 14 is shown retracted in the open position and the jaws 16a, 16b of the clamp are open, creating the gap 24 for an electrical conductor to pass into the interior region within the clamp. As shown in FIG. 6, a structural support 62 is positioned inside the body 12 between the jaws 16a, 16b. The structural support 62 includes, in part, and upwardly projecting knob on which a biasing element 60 is situated. The biasing element 60 sits between the structural support 62 and the upper end of the sleeve 14, and biases the sleeve 14 toward the closed position.

Figure 8:
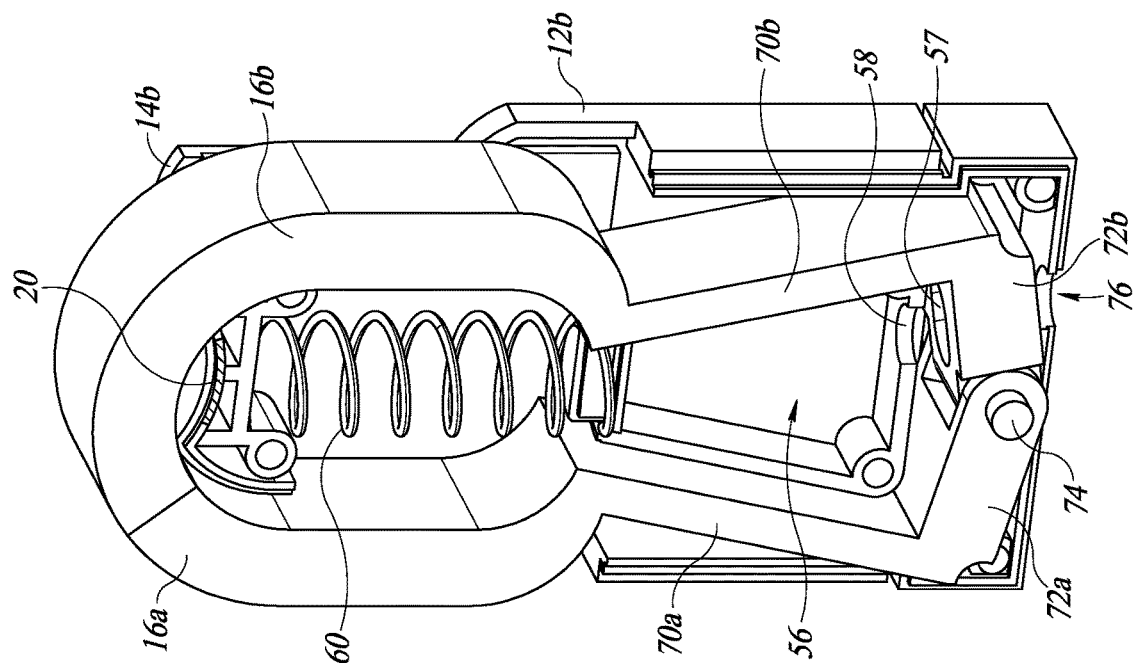
FIG. 8 is front, right perspective view of the sensor probe of FIG. 1, wherein a front of the body and a front of the sleeve are removed.
Figure 7:
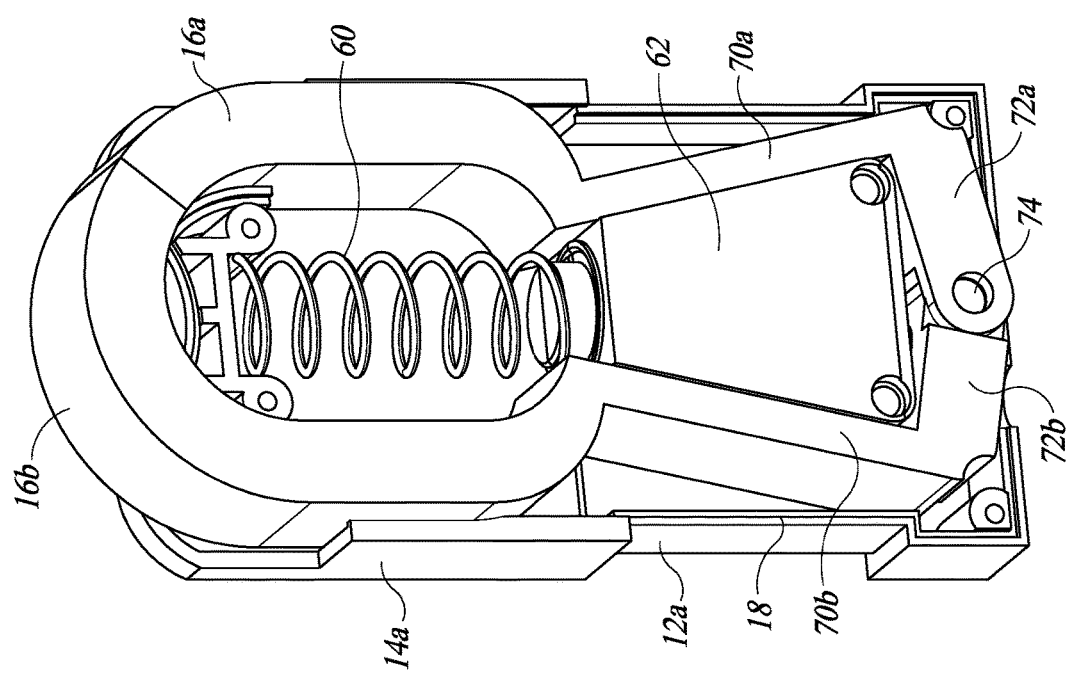
FIG. 7 is rear, right perspective view of the sensor probe of FIG. 1, wherein a rear of the body and a rear of the sleeve are removed.

In FIG. 6, the biasing element 60 is a spring. With the sleeve 14 shown in the open position in FIG. 6, the spring 60 is compressed against the structural support 62. FIGS. 7 and 8, as will be discussed below, show the spring 60 decompressed, with the sleeve 14 in the closed position. Thus, the sleeve 14 is normally held in the closed position until such time that a user of the sensor probe 10 pulls (i.e., retracts) the sleeve 14 downward toward the open position. When the user releases the sleeve 14, the biasing force of the spring 60 pushes (i.e., extends) the sleeve 14 upward toward the closed position.

In some embodiments, the sensor probe 10 further includes a locking element 59 that releasably secures the sleeve 14 in at least one of the open position or the closed position when the sleeve is retracted to the open position or extended to the closed position, respectively. In the embodiment illustrated in FIG. 6, the locking element 59 is a detent that projects inwardly from the sleeve 14 into a side of the body 12. The detent 59 releasably secures the sleeve 14 in the open position. In other embodiments, such detent may be outwardly projecting or an alternative mechanism may be employed to releasably secure the sleeve 14 to the body 12.

In some embodiments, the sensor probe 10 further includes a biasing element 64 that biases at least one of the first jaw 16a and/or the second jaw 16b away from the other of the first or second jaw 16a, 16b, and causes the clamp 16 to open when the sleeve 14 is retracted toward the open position. The embodiment of the sensor probe 10 illustrated in FIG. 6 includes a biasing element 64 in the form of two torsion springs having one side bearing against the structural support 62 and the other side bearing against lower legs of the jaws 16a, 16b. Where the structural support 62 is fixed, the torsion springs 64 exert an outward biasing force on the jaws 16a, 16b. Thus, when the sleeve 14 is in the open position and the jaws 16a, 16b are exposed outside the sides 20 of the sleeve 14, the jaws 16a, 16b rotate outward and separate from each other until the lower legs of the jaws 16a, 16b bear against an inner sidewall of the body 12. For simplicity of illustration, the torsion springs 64 are not shown in FIGS. 7 and 8.

In an alternate embodiment, the sensor probe 10 may include a biasing element that biases at least one of the first jaw 16a or the second jaw 16b toward the other of the first or second jaw 16a, 16b when the sleeve is extended toward the closed position. In such an alternate embodiment, the sensor probe 10 includes a mechanism coupled to the sleeve 14 that pushes the first and second jaws 16a, 16b away from each other with a force greater than the biasing force of the biasing element when the sleeve 14 is retracted to the open position. When the sleeve 14 is returned to the closed position, the mechanism allows the biasing element to push the first and second jaws 16a, 16b toward each other into a closed position.

FIG. 7 is rear, right perspective view of the sensor probe shown in FIG. 1 in which the rear 12b of the body 12 and the rear 14b of the sleeve 14 are removed, while FIG. 8 is front, right perspective view of the sensor probe shown in FIG. 1 in which the front 12a of the body 12 and the front 14a of the sleeve 14 are removed. In FIGS. 7 and 8, the sleeve 14 is extended in the closed position and the jaws 16a, 16b of the clamp are closed.

In some embodiments, at least one of the first jaw 16a and/or the second jaw 16b is coupled to a hinge 74, and when the sleeve is retracted toward the open position, the at least one of the first jaw or the second jaw 16a, 16b pivot about the hinge 74 away from the other jaw 16a, 16b to create the gap 24 (see FIG. 6). In other embodiments, as shown in FIGS. 7 and 8, the first jaw 16a and the second jaw 16b are each coupled to a hinge 74, and when the sleeve 14 is retracted toward the open position, both the first jaw 16a and the second jaw 16b pivot about the hinge 14 away from each other to create the gap 24.

As illustrated in FIGS. 7 and 8, the jaw 16a includes a lower leg 70a coupled to a foot 72a while the jaw 16b includes a lower leg 70b coupled to a foot 72b. Both the foot 72a and the foot 72b are rotatably coupled to the hinge 74. When the sleeve 14 is moved (i.e., extended) toward the closed position, the jaws 16a, 16b pivot about the hinge 74 until the jaws 16a, 16b contact each other as shown. The support structure 62 may be sized, shaped, and positioned such that the lower legs 70a, 70b contact outer sidewalls of the support structure 62 when the sleeve 14 is moved toward the closed position.

When the sleeve 14 is moved (i.e., retracted) to the open position, the jaws 16a, 16b pivot about the hinge 74 until the lower legs 70a, 70b contact the inner sidewalls of the body 12. In some embodiments, the jaws 16a, 16b freely pivot about the hinge 74 when the sleeve 14 is in the open position and no longer constrain the position of the jaws 16a, 16b. In some embodiments, biasing elements such as the torsion springs 64 shown in FIG. 6 are positioned within the sensor probe 10 to exert a outward biasing force on the lower legs 70a, 70b so that the jaws 16a, 16b tend to rotate apart when the sleeve 14 is moved to the open position.

The sensor probe 10 may further include circuitry within the body 12 to control function of the sensor probe 10 and communicate with the measuring instrument 40 shown in FIGS. 3 and 4. In in some embodiments, such circuitry (not shown) may be positioned in an interior space 56 of the support structure 62. The circuitry may be coupled by wires (not shown) to the non-contact sensor 20 to receive signals from the sensor 20 indicating a detected parameter, such as voltage, of an insulated conductor. In embodiments where the jaws 16a, 16b are configured to sense current flowing in an insulated conductor (e.g., in a manner similar to known current clamps), the circuitry may also be coupled to the jaws 16a, 16b to receive signals indicating a detected current of the insulated conductor.

The cable 42 shown in FIGS. 3 and 4 may extend into the sensor probe 10 via an aperture 76 in the body 12. Wires within the cable 42 may further extend through an aperture 57 in the foot 72b and an aperture 58 in the support structure 62 and electrically couple to such circuitry within the interior space 56.

Figure 10:
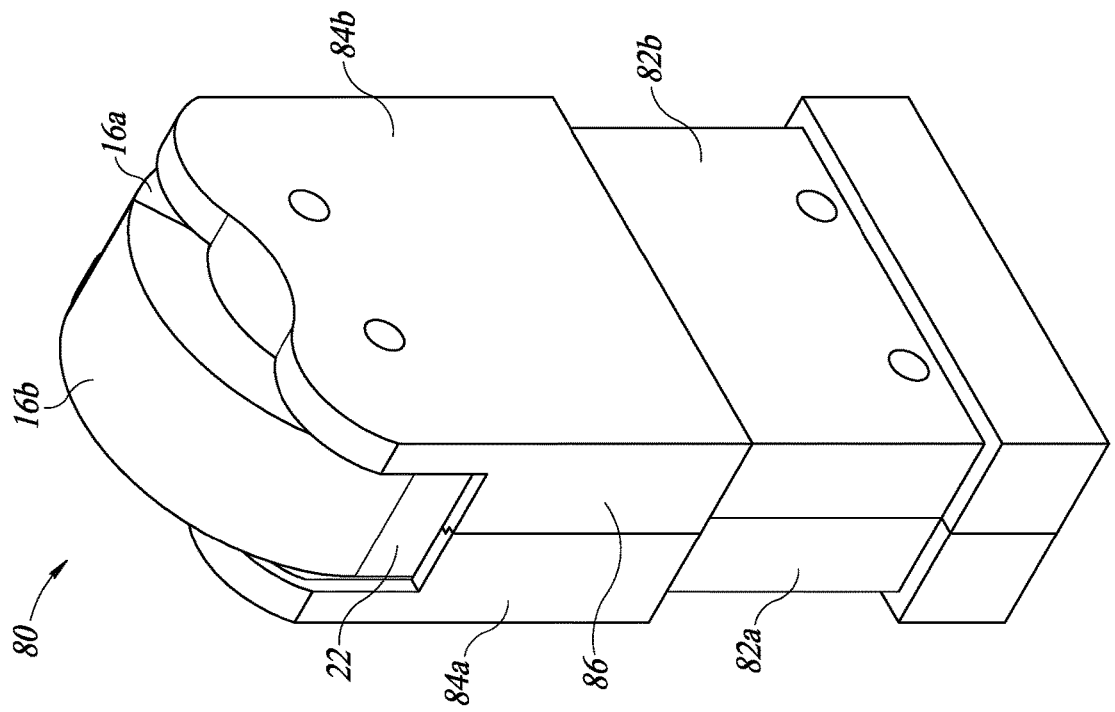
FIG. 10 is a rear, right perspective view of the sensor probe of FIG. 9.
Figure 9:
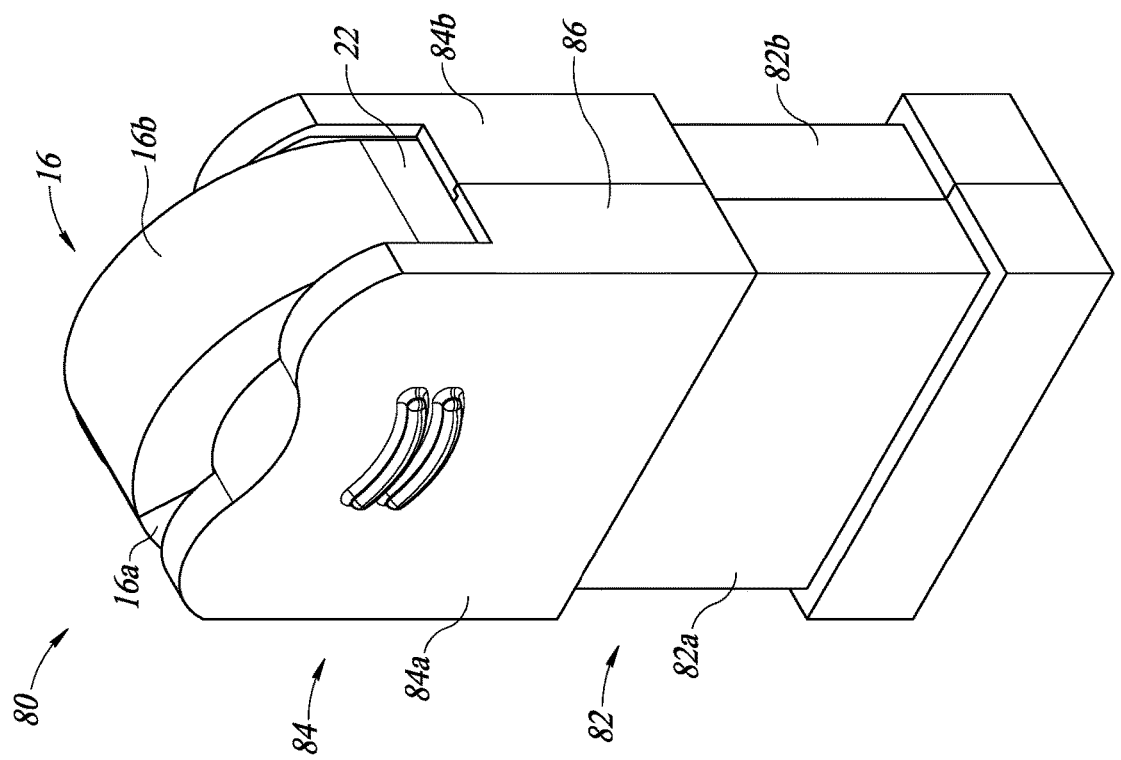
FIG. 9 is a front, right perspective view of another non-limiting embodiment of an electrical parameter sensor probe that includes a body, a sleeve, a clamp, and a non-contact sensor, wherein the sleeve is shown in a closed position.

FIGS. 9-12 illustrate another non-limiting embodiment of a sensor probe 80 constructed according to the present disclosure. In particular, FIG. 9 provides a front, right perspective view of the sensor probe 80 which includes a body 82, a sleeve 84, a clamp 16, and a non-contact sensor 20. The sleeve 84 is shown in a closed position and the jaws 16a, 16b of the clamp 16 are likewise closed. FIG. 10 provides a rear, right perspective view of the sensor probe 80 shown in FIG. 9.

Figure 12:
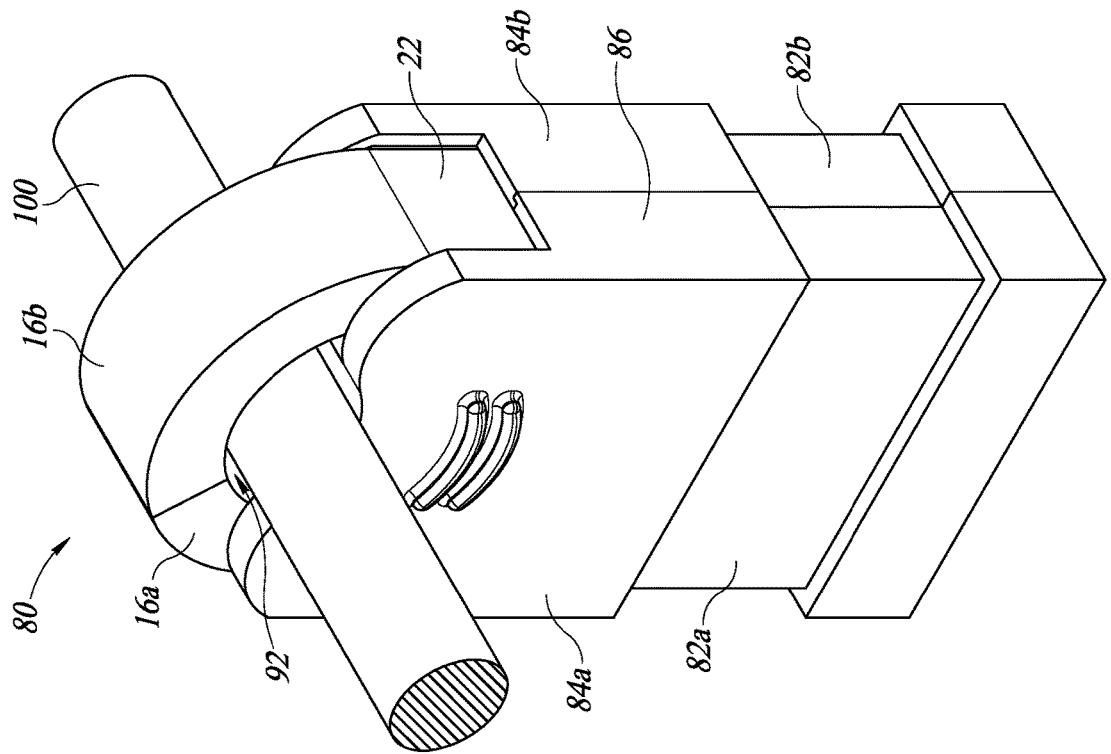
FIG. 12 is a front, right perspective view of the sensor probe of FIG. 9, wherein the sleeve is shown in a partially closed position and jaws of the clamp are closed around an insulated conductor under test.
Figure 11:
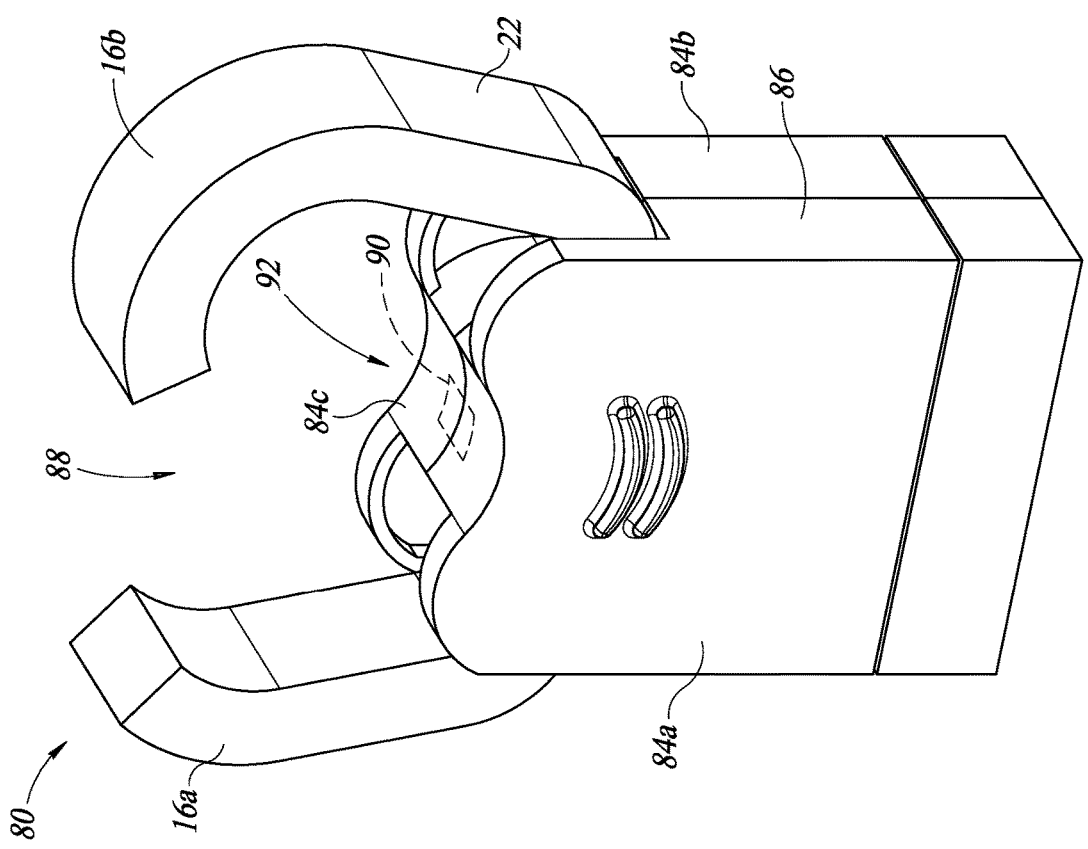
FIG. 11 is a front, right perspective view of the sensor probe of FIG. 9, wherein the sleeve is shown in an open position and jaws of the clamp are open.

As for FIGS. 11 and 12, FIG. 11 provides a front, right perspective view of the sensor probe 80, wherein the sleeve 14 is shown in an open position and the jaws 16a, 16b of the clamp 16 are open. FIG. 12 provides a front, right perspective view of the sensor probe 80, wherein the sleeve 14 is shown in a partially closed position and the jaws 16a, 16b of the clamp 16 are closed around an insulated conductor 100 under test.

The sensor probe 80 in FIGS. 9-12 differs from the sensor probe 10 in FIGS. 1-8 in that the sleeve 84 fully surrounds the body 82 when the sleeve 84 is retracted to the open position. The sleeve 84 includes a front 84a and a rear 84b that are coupled to one another. Similarly, the body 82 includes a front 82a and a rear 82b that are coupled to one another. In the closed position, one or both sidewalls 86 of the sleeve 84 bear against one or both of the jaws 16a, 16b and constrain the jaws 16a, 16b in the closed position as shown in FIGS. 9 and 10.

When the sleeve 84 is moved (i.e. retracted) to the open position, as shown in FIG. 11, the front 82a and the rear 82b of the body 82 are positioned within the front 84a and the rear 84b of the sleeve 84. Furthermore, the jaws 16a, 16b pivot outward (e.g., about a hinge similar to the hinge 74) to separate and create a gap 88. Biasing elements, e.g., which may be similar to the torsion springs 64 shown in FIG. 6, may be positioned within the sensor probe 80 to exert a outward biasing force on the jaws 16a, 16b.

The sleeve 84 includes a concave saddle 84c with a non-contact sensor 90 (e.g., a non-contact voltage sensor) coupled thereto or positioned therein. Like the non-contact sensor 20 described earlier, the non-contact sensor 90 is operative to sense one or more electrical parameters in an insulated conductor 100 under test, as shown in FIG. 12. Also, as mentioned above, one or more non-contact sensors may additionally or alternatively be coupled to or positioned in one or both of the jaws 16a, 16b of the clamp 16.

When the sleeve 84 is extended toward the closed position, the size of the interior region 92 within the sleeve 84 is reduced. In at least one embodiment, the sleeve 84 is extended upward, reducing the size of the interior region 92 until either the sleeve 44 is in a partially closed position and bears against the insulated conductor 100 shown in FIG. 12, or the sleeve 84 is in a fully closed position. Thus, when the insulated conductor 100 is positioned within the interior region of the clamp 16, the reduced size of the interior region 92 causes the insulated conductor 100 to sit within the saddle 84c of the sleeve 84 and be positioned proximate to the non-contact sensor 90. Depending on the size of the insulated conductor 100, the closed jaws 16a, 16b may also bear against the insulated conductor 100 as shown in FIG. 12, and help maintain the position of the insulated conductor 100 proximate to the non-contact sensor 90.

All other interior construction and function of the sensor probe 80 may be similar to or the same as shown and described above with regard to FIGS. 1-8.

It should be understood that the various embodiments described above can be combined to provide yet further embodiments. To the extent that they are not inconsistent with the teachings and definitions herein, the disclosure in U.S. Provisional Patent Application No. 62/421,124, filed Nov. 11, 2016; U.S. Pat. No. 10,119,998, issued Nov. 6, 2018; U.S. Pat. No. 10,139,435, issued Nov. 27, 2018; U.S. Pat. No. 10,281,503, issued May 7, 2019; U.S. Pre-Grant Publication No. 2018/0136260, published May 17, 2018, and U.S. Pat. No. 10,352,967, issued Jul. 16, 2019, as well as U.S. Pre-Grant Publication No. 2019/0346492, published Nov. 14, 2019, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A sensor probe operative to detect an electrical parameter of an insulated conductor, the sensor probe comprising:
    a body;
    a sleeve fitted to the body, wherein the sleeve is movable along the body between a closed position and an open position;
    a clamp that includes a first jaw and a second jaw, wherein at least one of the first jaw or the second jaw is positioned at least partially within the sleeve when the sleeve is in the closed position, and when the first and second jaws are closed against each other, the first and second jaws contain an interior region within the clamp; and
    a non-contact sensor coupled to the sleeve and positioned at or near a perimeter of the interior region within the clamp, wherein the non-contact sensor is operative to sense at least one electrical parameter of the insulated conductor without requiring galvanic contact with the insulated conductor when the insulated conductor is positioned within the interior region of the clamp,
        wherein when the sleeve is retracted along the body toward the open position, the first jaw and the second jaw are configured to separate from each other and create a gap that allows the insulated conductor to pass between the first jaw and the second jaw into the interior region within the clamp, and when the sleeve is extended along the body toward the closed position, the first jaw and the second jaw are configured to close the gap and thereby close the interior region within the clamp, and
    wherein a size of the interior region within the clamp is adjustable by movement of the sleeve along the body.

2. The sensor probe of claim 1, wherein at least one of the first jaw or the second jaw is coupled to a hinge, and when the sleeve is retracted toward the open position, the at least one of the first jaw or the second jaw is configured to pivot about the hinge away from each other to create the gap.

3. The sensor probe of claim 1, wherein the first jaw and the second jaw are each coupled to a hinge, and when the sleeve is retracted toward the open position, both the first jaw and the second jaw are configured to pivot about the hinge away from each other to create the gap.

4. The sensor probe of claim 1, wherein at least a portion of the sleeve is positioned within the body when the sleeve is retracted toward the open position.

5. The sensor probe of claim 1, wherein at least a portion of the body is positioned within the sleeve when the sleeve is retracted toward the open position.

6. The sensor probe of claim 1, further comprising a biasing element that biases the sleeve toward the closed position.

7. The sensor probe of claim 1, further comprising a locking element that releasably secures the sleeve in at least one of the open position or the closed position when the sleeve is retracted to the open position or extended to the closed position, respectively.

8. The sensor probe of claim 1, further comprising a biasing element that biases at least one of the first jaw or the second jaw away from each other when the sleeve is retracted toward the open position, or biases at least one of the first jaw or the second jaw toward the other of the first or second jaw when the sleeve is extended toward the closed position.

9. The sensor probe of claim 1, wherein when the sleeve is retracted toward the open position, a greater portion of at least one of the first jaw or the second jaw is exposed outside the sleeve.

10. The sensor probe of claim 1, wherein when the insulated conductor is positioned within the interior region of the clamp, the non-contact sensor coupled to the sleeve is operative to sense a voltage in the insulated conductor without requiring galvanic contact with the insulated conductor.

11. The sensor probe of claim 10, wherein the size of the interior region within the clamp is reduced to a reduced size when the sleeve is extended toward the closed position.

12. The sensor probe of claim 11, wherein when the insulated conductor is positioned within the interior region of the clamp, the reduced size of the interior region causes the insulated conductor to be positioned proximate to the non-contact sensor.

13. The sensor probe of claim 1, wherein the non-contact sensor coupled to the sleeve is a first non-contact sensor, the sensor probe further comprising a second non-contact sensor positioned on the first jaw or the second jaw at or near the perimeter of the interior region within the clamp, wherein the second non-contact sensor is operative to sense at least one additional electrical parameter of the insulated conductor when the insulated conductor is positioned within the interior region of the clamp.

14. A device configured to measure an electrical parameter of an insulated conductor, the device comprising:
    a sensor probe that includes:
    a body;
    a sleeve fitted to the body, wherein the sleeve is movable along the body between a closed position and an open position;
    a clamp that includes a first jaw and a second jaw, wherein at least one of the first jaw or the second jaw is positioned at least partially within the sleeve when the sleeve is in the closed position, and when the first and second jaws are closed against each other, the first and second jaws contain an interior region within the clamp; and
    a non-contact sensor coupled to the sleeve and positioned at or near a perimeter of the interior region within the clamp, wherein the non-contact sensor is operative to sense at least one electrical parameter of the insulated conductor without requiring galvanic contact with the insulated conductor when the insulated conductor is positioned within the interior region of the clamp; and
    control circuitry configured to process sensor data indicative of a signal detected by the non-contact sensor and to measure the electrical parameter of the insulated conductor,
        wherein when the sleeve is retracted along the body toward the open position, the first jaw and the second jaw are configured to separate from each another and create a gap that allows the insulated conductor to pass between the first jaw and the second jaw into the interior region within the clamp, and when the sleeve is extended along the body toward the closed position, the first jaw and the second jaw close the gap and thereby close the interior region within the clamp, and wherein a size of the interior region within the clamp is adjustable by movement of the sleeve along the body.

15. The device of claim 14, further comprising a main body that contains the control circuitry, wherein the sensor probe is detachably connectable to at least one interface connector of the main body.

16. The device of claim 14, wherein the body of the sensor probe contains the control circuitry.

17. The device of claim 14, wherein when the insulated conductor is within the interior region of the clamp, the non-contact sensor coupled to the sleeve is operative to sense a voltage in the insulated conductor without requiring galvanic contact with the insulated conductor.

18. The device of claim 14, wherein the non-contact sensor coupled to the sleeve is a first non-contact sensor, the sensor probe further comprising a second non-contact sensor positioned on the first jaw or the second jaw at or near the perimeter of the interior region within the clamp, wherein the second non-contact sensor is operative to sense at least one additional electrical parameter of the insulated conductor when the insulated conductor is positioned within the interior region of the clamp.

19. A sensor probe operative to detect an electrical parameter of an insulated conductor, the sensor probe comprising:

a body having a sleeve that is moveable along the body between an open position and a closed position;

a clamp having a first jaw and a second jaw that, when closed against each other, contain an interior region within the clamp; and a non-contact sensor coupled to the sleeve and positioned at or near a perimeter of the interior region within the clamp, wherein the non-contact sensor is operative to detect at least one electrical parameter of the insulated conductor without requiring galvanic contact with the insulated conductor when the insulated conductor is positioned within the interior region of the clamp, wherein, when the sleeve is in the open position, the first and second jaws are positioned apart from each other to create a gap that allows the insulated conductor to pass between the first jaw and the second jaw into the interior region within the clamp, and when the sleeve is in the closed position, the sleeve causes one or both of the first and second jaws to close the gap and thereby close the interior region within the clamp, and wherein a size of the interior region within the clamp is reduced when the sleeve is moved toward the closed position.

20. The sensor probe of claim 19, wherein when the insulated conductor is positioned within the interior region of the clamp, the first and second jaws are configured to detect a current and the non-contact sensor is configured to detect a voltage of the insulated conductor, without requiring galvanic contact with the insulated conductor.

* * * * *